United States Patent
Ting et al.

(10) Patent No.: US 12,176,058 B2
(45) Date of Patent: Dec. 24, 2024

(54) MEMORY DEVICE HAVING SWITCHING DEVICE OF PAGE BUFFER AND ERASE METHOD THEREOF

(71) Applicant: MACRONIX International Co., Ltd., Hsinchu (TW)

(72) Inventors: Jung-Chuan Ting, Hsinchu County (TW); I-Chen Yang, Miaoli County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 324 days.

(21) Appl. No.: 17/953,094

(22) Filed: Sep. 26, 2022

(65) Prior Publication Data

US 2024/0105239 A1    Mar. 28, 2024

(51) Int. Cl.
| | | |
|---|---|---|
| *G11C 16/14* | (2006.01) | |
| *G11C 7/06* | (2006.01) | |
| *G11C 7/10* | (2006.01) | |
| *G11C 7/12* | (2006.01) | |
| *G11C 16/16* | (2006.01) | |

(52) U.S. Cl.
CPC ............ *G11C 7/1057* (2013.01); *G11C 7/067* (2013.01); *G11C 7/12* (2013.01)

(58) Field of Classification Search
CPC ......... G11C 7/1057; G11C 7/067; G11C 7/12; G11C 16/0483; G11C 16/24; G11C 16/16; G11C 16/0441; G11C 16/14; G11C 16/26
See application file for complete search history.

(56) References Cited

U.S. PATENT DOCUMENTS 9,042,177 B2    5/2015  Aritome
2004/0257888 A1*  12/2004  Noguchi ............. G06F 11/1008
                                                    714/E11.034

(Continued)

FOREIGN PATENT DOCUMENTS

JP    2006185533    7/2006
JP    2011119530    6/2011
(Continued)

OTHER PUBLICATIONS

"Search Report of Europe Counterpart Application", issued on Aug. 25, 2023, pp. 1-9.

(Continued)

*Primary Examiner* — Hien N Nguyen
(74) *Attorney, Agent, or Firm* — J.C. PATENTS

(57) ABSTRACT

A memory device having a switching device for a page buffer is provided, and includes a plurality of switching units coupled between a memory cell array and a sense amplification circuit of the page buffer. Each of the plurality of switching units further comprising: a high voltage element and a low voltage element that are connected in series to each other. A first end of the high voltage element is coupled to the sense amplification circuit, and a first end of the low voltage element is coupled to a common source line of the memory cell array. A second end of the high voltage element and a second end of the low voltage element are connected to each other and coupled to a corresponding bit line of the memory cell array. The common source line coupled to each of the plurality of switching units shares a common active region.

20 Claims, 14 Drawing Sheets

(56) References Cited

U.S. PATENT DOCUMENTS

| | | | |
|---|---|---|---|
| 2005/0204212 A1* | 9/2005 | Noguchi | G11C 29/76 714/710 |
| 2006/0285388 A1* | 12/2006 | Ha | G11C 16/30 365/185.18 |
| 2007/0153576 A1* | 7/2007 | Oh | G11C 16/26 365/185.11 |
| 2009/0129157 A1* | 5/2009 | Honda | G11C 16/3418 365/189.04 |
| 2010/0157677 A1* | 6/2010 | Furuyama | G11C 16/24 365/185.24 |
| 2016/0329344 A1 | 11/2016 | Yeh et al. | |
| 2020/0234770 A1* | 7/2020 | Yeh | G11C 5/145 |
| 2021/0391351 A1 | 12/2021 | Takimoto et al. | |
| 2022/0139462 A1* | 5/2022 | Du | G11C 7/12 365/228 |
| 2023/0154544 A1* | 5/2023 | Cho | G11C 11/5642 365/185.18 |

FOREIGN PATENT DOCUMENTS

| | | |
|---|---|---|
| JP | 2015060602 | 3/2015 |
| JP | 2016167331 | 9/2016 |
| TW | I696182 | 6/2020 |
| WO | 2013016495 | 1/2013 |

OTHER PUBLICATIONS

"Office Action of Japan Counterpart Application", issued on Jan. 31, 2024, pp. 1-7.

"Office Action of Taiwan Counterpart Application", issued on Dec. 19, 2023, pp. 1-6.

* cited by examiner

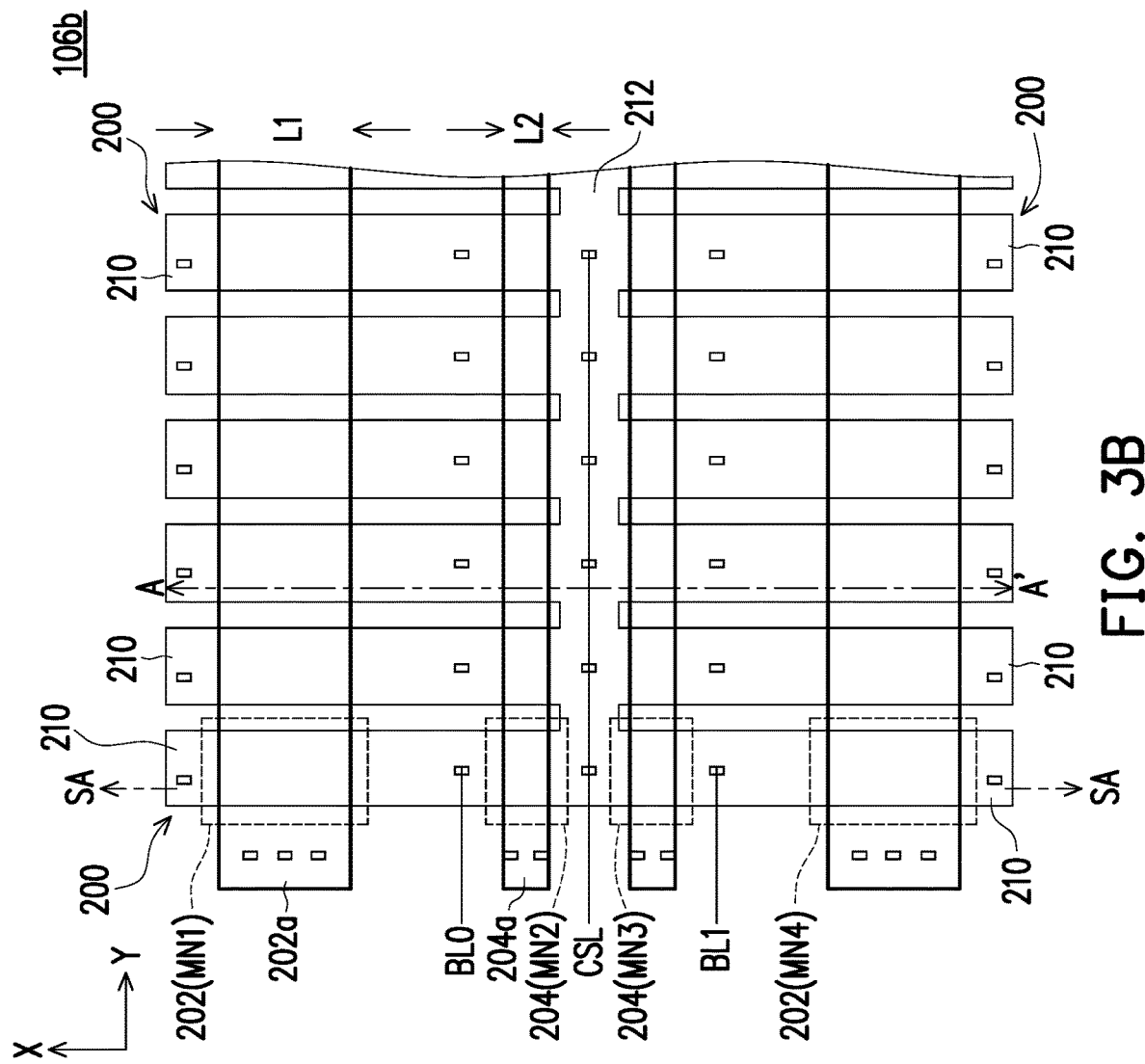
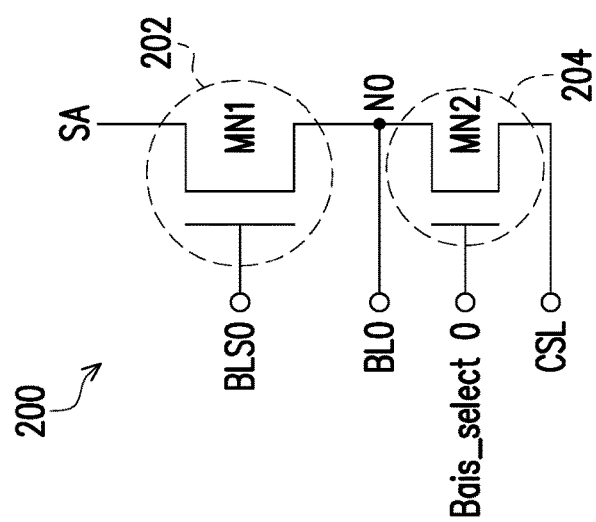
FIG. 3A
FIG. 3B

MEMORY DEVICE HAVING SWITCHING DEVICE OF PAGE BUFFER AND ERASE METHOD THEREOF

BACKGROUND

Technical Field

The present invention relates to a memory device having a switching device of a page buffer and an erase method thereof.

Description of Related Art

With the development of the memory device, the number of memory cells in the memory device is also increasing, resulting in an increase in the area of the memory device. The memory device mainly includes a memory cell array and its related circuits, and a page buffer is connected between the bit lines of the memory cell array and the internal data output line. In general, the switching device may be included within the page buffer, which comprises high voltage elements with thin gate oxide layers and deep junctions for erase operations. Therefore, these high voltage elements will occupy more area. Therefore, how to provide a structure of the switching device of the page buffer, which can achieve the existing functions and reduce the memory area, is a subject that needs to be worked on.

SUMMARY

Based on the above description, the present invention provides a switching device of a page buffer, a memory device having the switching device, and an erasing method thereof.

According to one embodiment of the present invention, a memory device having a switching device for a page buffer is provided. the memory device having a switching device for a page buffer comprises a plurality of switching units coupled between a memory cell array and a sense amplification circuit of the page buffer. Each of the plurality of switching units further comprising: a high voltage element and a low voltage element that are connected in series to each other. A first end of the high voltage element is coupled to the sense amplification circuit, and a first end of the low voltage element is coupled to a common source line of the memory cell array. A second end of the high voltage element and a second end of the low voltage element are connected to each other and coupled to a corresponding bit line of the memory cell array. The common source line coupled to each of the plurality of switching units shares a common active region.

According to another embodiment of the present invention, a memory device having a switching device for a page buffer is provided. The memory device having a switching device for a page buffer comprises a memory cell array and a page buffer. The memory cell array includes a plurality of bit lines, a plurality of word lines and a plurality of memory cells. Each of the plurality of memory cells is respectively disposed at intersections of the plurality of word lines and the plurality of bit lines. The page buffer is coupled to the plurality of bit lines of the memory cell array. The page buffer further includes a switching device and a sense amplifier circuit. The switching device further includes a plurality of switching units coupled between the memory cell array and the sense amplification circuit. Each of the plurality of switching units further comprises a high voltage element and a low voltage element that are connected in series to each other. A first end of the high voltage element is coupled to the sense amplification circuit, and a first end of the low voltage element is coupled to a common source line of the memory cell array. A second end of the high voltage element and a second end of the low voltage element are connected to each other and coupled to a corresponding bit line of the memory cell array. The common source line coupled to each of the plurality of switching units shares a common active region.

According to another embodiment of the present invention, an erase method for a memory device is provided. The memory device includes a memory cell array and a page buffer couple to the memory cell array. The page buffer includes a switching device having a plurality of switching units. Each of the switching unit includes a first transistor as a high voltage element and a second transistor as a low voltage element. The first and the second transistors are connected in series. A first end of the first transistor is coupled to a sense amplification circuit of the page buffer, and a first end of the second transistor is coupled to a common source line of the memory cell array. A second end of the first transistor and a second end of the second transistor are connected to each other and coupled to a corresponding bit line of the memory cell array. The common source line coupled to each of the plurality of switching units shares a common active region. The erase method for each of the switching unit comprises turning off the first transistor; applying a first voltage to a gate of the second transistor to turn on the second transistor; when the first voltage applied to the gate of the second transistor is stably maintained for a preset time, an erase voltage is applied to the common source line; boosting a gate voltage on the gate of the second transistor by the erase voltage to a sum of the erase voltage and the first voltage, and boosting a bit line voltage on the corresponding bit line to the erase voltage; and performing a two-side erase on memory cells on the corresponding bit line.

BRIEF DESCRIPTION OF THE DRAWINGS

FIG. 3A illustrates a schematic diagram of a circuit configuration of a switching unit of a switching device in a page buffer according to one embodiment of the present invention.

FIG. 3B illustrates a schematic layout structure of a switching device of a page buffer according to one embodiment of the present invention.

DESCRIPTION OF THE EMBODIMENTS

Figure 1:
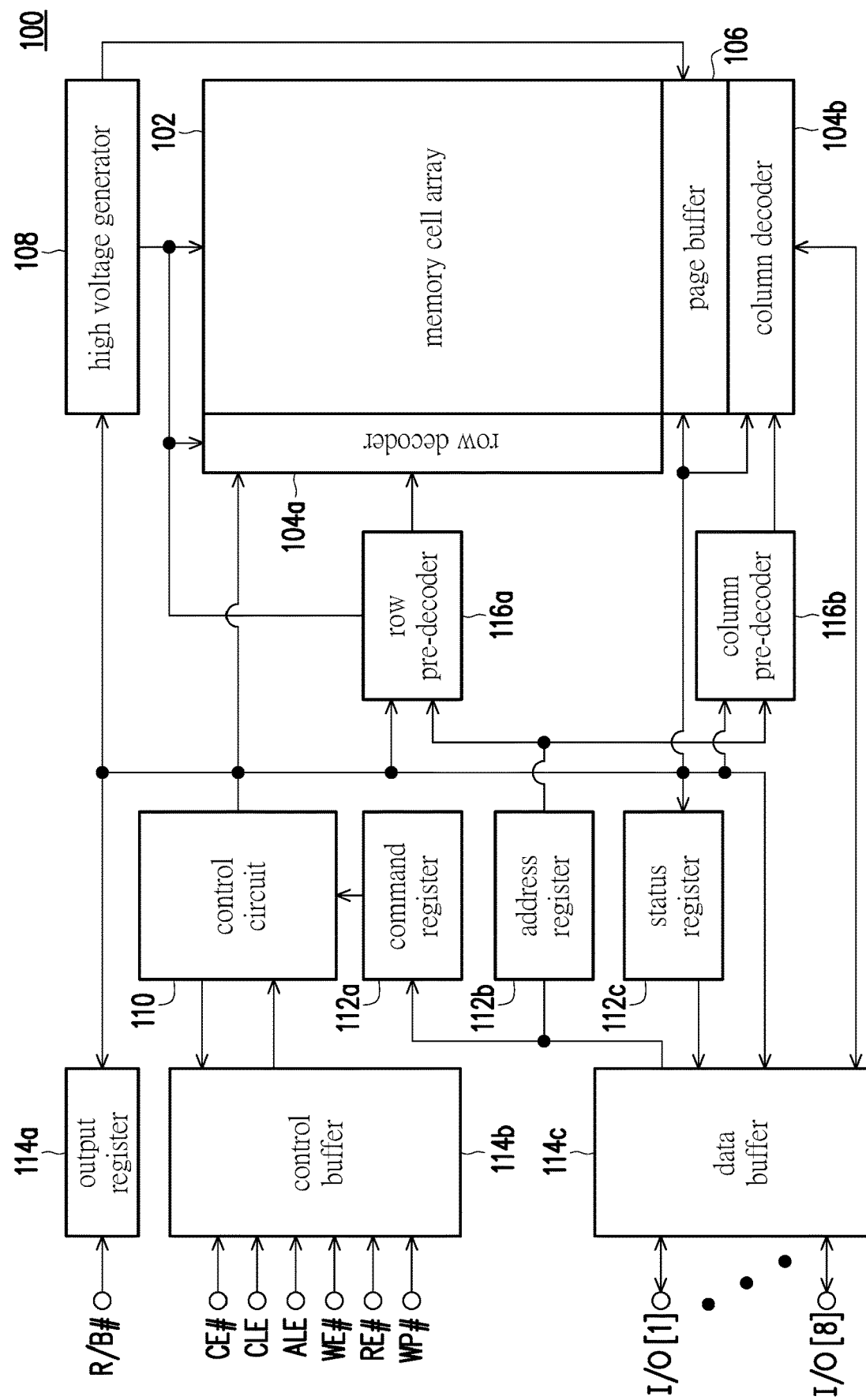
FIG. 1 illustrates a block diagram of a circuit configuration of a memory device.

FIG. 1 illustrates a block diagram of a circuit configuration of a memory device. The memory device 100 basically comprises a memory cell array 102, a row decoder 104a, a column decoder 104b, a page buffer 106, a high voltage generator 108, a control circuit 110, a command register 112a, an address register 112b, a status register 112c, an output buffer 114a, a control buffer 114b, a data buffer 114c, a row pre-decoder 116a and column pre-decoder 116b.

The memory cell array 102 may comprise a plurality of memory cells, the memory cell array 102 may comprise a plurality of bit lines BL and a plurality of word lines WL, and the plurality of memory cells are respectively arranged at the intersections of the plurality of bit lines and the plurality of word lines WL. A specific memory cell in the memory cell array 102 can be specified by decoding the address signal with the row decoder 104a and the column decoder 10b, so that the memory cells can be written (programmed), read or erased.

The high voltage generator 108 can generate the high voltage required for the memory operation to the memory cell array 102 and the page buffer 106. The control circuit 110 can control all operations of the memory cell array 102 and peripheral circuits. Other registers and buffers can be used for temporary storage and buffering of various data, signals, or commands. The present invention does not limit the structure of the memory device 100, and those skilled in the art can change or modify the design of the internal circuit of the memory device 100 according to design requirements, which does not affect the implementation of the present invention.

Figure 2:
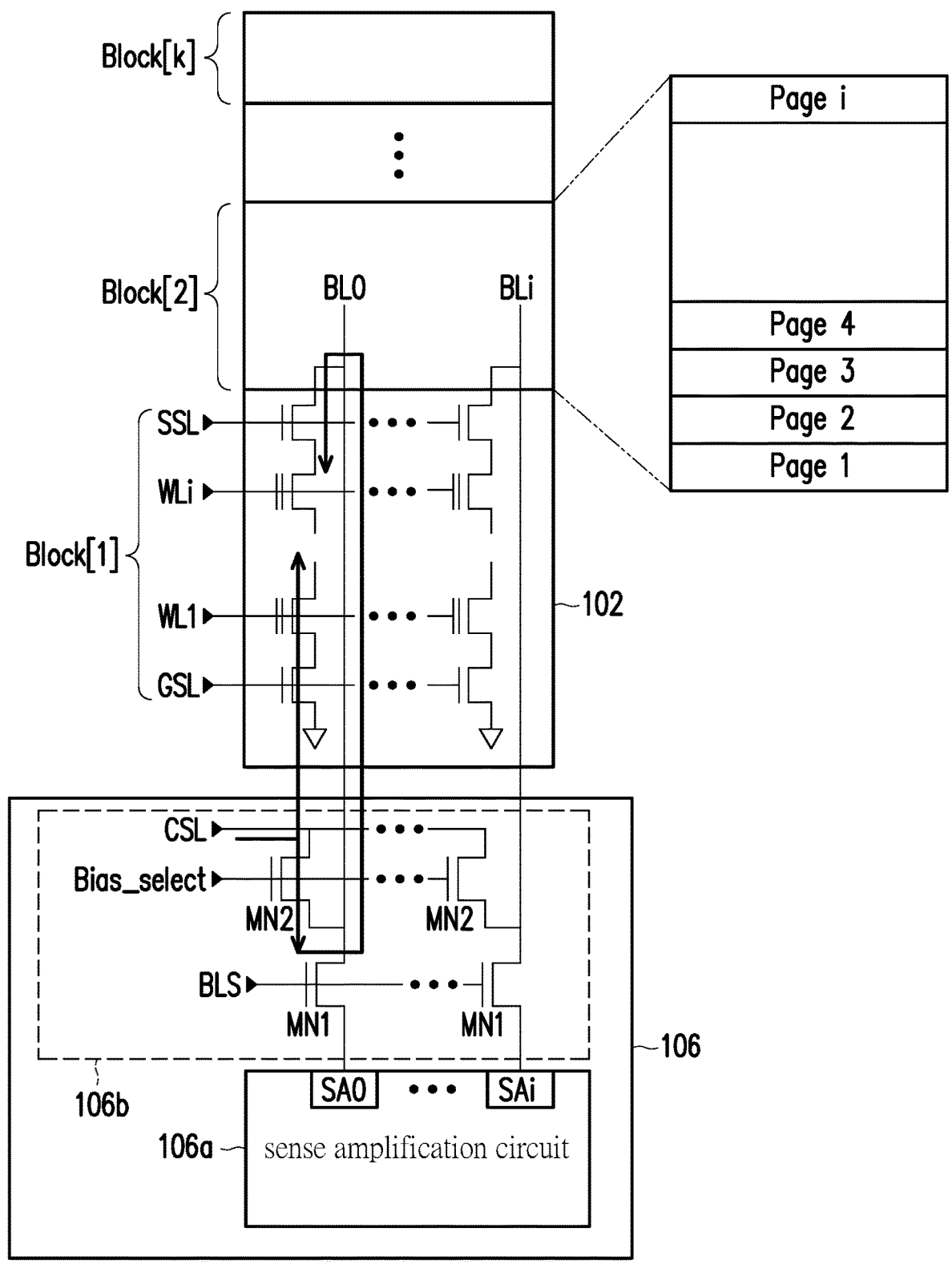
FIG. 2 illustrates a schematic circuit diagram of a switching device of a page buffer.

FIG. 2 is a schematic circuit diagram of the switching device of the page buffer. As shown in FIG. 2, the memory cell array 102 may comprises a plurality of blocks (block) Block[1]~Block[k], and each block may comprise a plurality of pages, such as page 1~page i. As shown in FIG. 2, each block (e.g., Block[1]) comprises a plurality of bit lines BL0~BLi. Each bit line (e.g., BL0) is intersected with a plurality of word lines WL1 to WLi, a string select line (SSL) and a gate select line (GSL). The page buffer 106 comprises a sense amplification circuit 106a and a switching device 106b. The sense amplification circuit 106a may comprise a plurality of sense amplifiers SA0~SAi, which are respectively coupled to the corresponding bit lines BL0~BLi.

In addition, the switching device 106b may comprise a plurality of switching units, wherein each switching unit comprises a first transistor MN1 and a second transistor MN2. The first transistor MN1 and the second transistor MN2 are connected in series, and the connection point of the first transistor MN1 and the second transistor MN2 is coupled to the corresponding bit line (such as BL0). The gate of the first transistor MN1 receives the bit line selection signal BLS. One of the source/drain of the first transistor MN1 is coupled to the sense amplifier SA0 corresponding to the bit line BL0 in the sense amplification circuit 106a, and the other source/drain is coupled to the corresponding bit line BL0. The gate of the second transistor MN2 receives the bias voltage selection signal Bias_select, one of the source/drain is coupled to the common source line CSL, and the other source/drain is coupled to the corresponding bit cell line BL0.

In the switching device 106b, the gates of the first transistors MN1 of the switching units are coupled together, and the gates of the second transistors MN2 of the switching units are also coupled together. In addition, in this embodiment, the first transistors MN1 are high voltage elements and the second transistors MN2 are low voltage elements. That is, according to the embodiment of the present invention, each of switching units of the switching device 106b comprises a transistor serving as the high voltage element and a transistor serving as the low voltage element. Here, the first transistor MN1 and the second transistor MN2 are, for example, MOS transistors. The first transistor MN1 and the second transistor MN2 may have the same structure but different gate lengths.

Figure 3C:
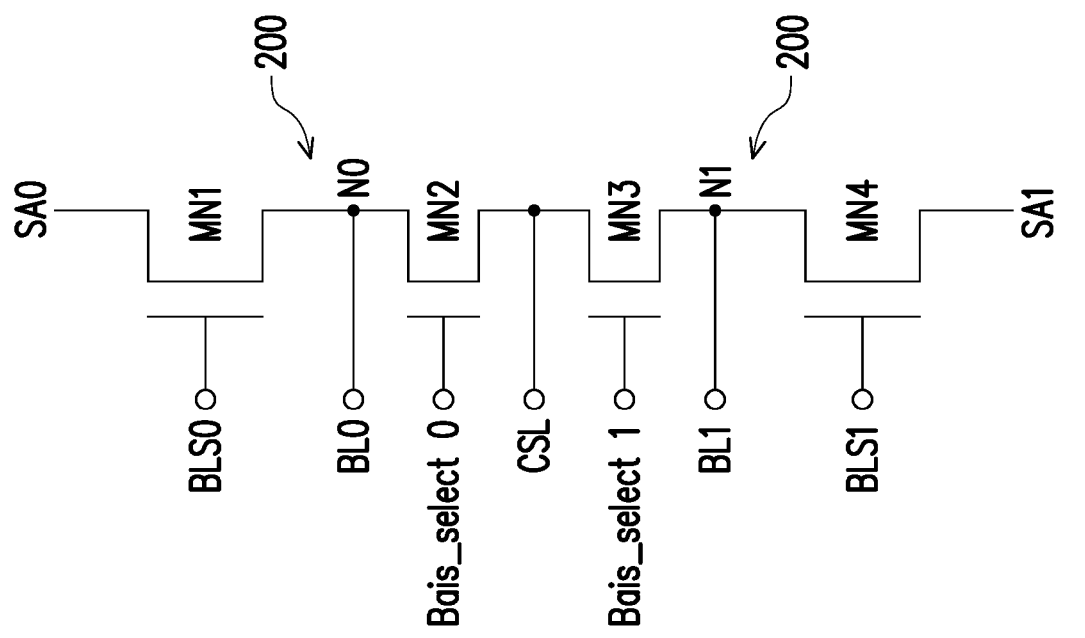
FIG. 3C illustrates a portion of an effective circuit of the switching device corresponding to the layout structure in FIG. 3B.

FIG. 3A is a schematic diagram of a circuit configuration of a switching unit of a switch device in a page buffer according to an embodiment of the present invention, and FIG. 3B is a schematic layout structure diagram of the switching device of the page buffer according to an embodiment of the present invention. FIG. 3C illustrates a portion of an effective circuit of the switching device corresponding to the layout structure in FIG. 3B.

As shown in FIG. 2, the switching device 106b is coupled between the memory cell array 102 and the sense amplification circuit 106a of the page buffer 106, and the switching device 106b is coupled to all the bit lines BL0~BLi of the memory cell array 102.

The switching device 106b comprises a plurality of switching units 200, and each switching unit 200 as shown in FIG. 3A is connected to a corresponding bit line BLj (j=0~i, BL0 in this example) in the memory cell array 102. One end of the switching unit 200 is connected to the sense amplifier SA corresponding to the bit line BL0, and the other end of the switching unit 200 is connected to the common source line CSL of the memory cell array 102. As shown in FIG. 3A, the switching unit 200 comprises a high voltage element 202 and a low voltage element 204 connected in series to each other. A first end of the high voltage element 202 is coupled to the sense amplification circuit 106a (SA), and a first end of the low voltage element 204 is coupled to the common source line CSL of the memory cell array 102. A second end of the high voltage element 202 and a second end of the low voltage element 204 are connected to each other (node NO) and coupled to a corresponding bit line BL0 of the plurality of bit lines BL0~BLi. The nodes of the common source lines CSL of the plurality of switching units 200 share a common active region 212 (refer to FIG. 3B). The high voltage element 202 and the low voltage element 204 are controlled by the bit line selection signal BLS0 and the bias voltage selection signal Bias_select0 respectively.

Specifically, the high-voltage element 202 and the low-voltage element 204 may be made by MOS transistors MN1 and MN2, respectively; namely, the switching unit 200 may comprise the first transistor MN1 as the high voltage element 202 and the second transistor MN2 as the low voltage element 204, and the first transistor MN1 and the second transistor MN2 are connected to each other in series at the node NO. The gate of the first transistor MN1 can receive the bit line selection signal BLS0, the first source/drain is coupled to the sense amplifier SA corresponding to the bit line BL0, and the second source/drain is coupled to the bit line BL0 through the node NO. The gate of the second transistor MN2 can receive the bias selection signal Bias_select0, the first source/drain is also coupled to the bit line BL0 through the node NO, and the second source/drain is coupled to the common source line CSL.

Furthermore, the gate length L2 of the second transistor MN2 is smaller than the gate length L1 of the first transistor MN1. In one embodiment, the ratio L1/L2 of the gate length L1 of the first transistor MN1 to the gate length L2 of the second transistor MN2 may be about 3~4. In addition, in one embodiment, the thickness T2 of the gate oxide layer of the second transistor MN2 is smaller than thickness T1 of the gate oxide layer of the first transistor MN1. In an example, the ratio T1/T2 of the thickness T1 of the gate oxide layer of the first transistor MN1 to the thickness T2 of the gate oxide layer of the second transistor MN2 may be about 5~6.

In addition, FIG. 3C illustrates a portion of an effective circuit of the switching device corresponding to the layout structure that is described later. In FIG. 3C, since the second source/drain of each of the second transistors MN2, MN3 are connected to the common source line CSL, and thus the portion of the circuit of the switching device 106b is formed by the switching units shown in FIG. 3A. In FIG. 3C, two switching units 200 in FIG. 3A are connected in series. The upper switching unit 200 connected to the bit line BL0 comprises the first transistor MN1 and the second transistor MN2, and similarly, the lower switching unit 200 connected to the bit line BL1 comprises the first transistor MN4 and the second transistor MN3. Here, the connection of the first transistor MN1 (MN4) and the second transistor MN2 (MN3) are the same as that shown in FIG. 3A, and its description is omitted. In addition, the gates of the first transistors MN1, MN4 receive the bit line select signal BLS0, BLS1 respectively and the gates of the second transistors MN1, MN4 receive the bias select signal Bias_select0, Bias_select1 respectively.

As shown in the layout structure diagram of the switching device shown in FIG. 3B, a plurality of switching units 200 are illustrated, and basically the number of switching units 200 is equal to the number of bit lines BL0~BLi of the memory cell array 102. In FIG. 3B, the switching device 106b comprises a plurality of first active regions 210 that extend in the first direction X; and a second active region 212 that extends in the second direction Y and substantially arranged along the middle positions of the first active regions 210. The first direction X and the second direction Y are intersected (not in parallel), and for example, the first direction X is substantially perpendicular to the second direction Y. The second active region 212 divides each of the first active regions 210 into a first area and a second area. As an example shown in FIG. 3B, each of the first active regions 210 above the second active region 212 is an example of the first area, and each of the first active regions 210 below the second active region 212 is an example of the second area. Here, above or below the second active region 212 is described with reference to FIG. 3B, not to limit the scope of the invention.

The switching device 106b further comprises a first gate 202a and a second gate 204a, arranged on each of the first areas and the second areas of the first active regions 210. For example, in the first area of each first active region 210, the first gate 202a and the second gate 204a extend in the second direction Y and arranged above each of the first active regions 210. The first gate 202a and the second gate 204a are substantially perpendicular to the first areas of each of the first active regions 210. The second gate 204a is closer to the second active region 212 than the first gate 202a. The first gate 202a and the first areas of each of the first active regions 210 together form a plurality of first transistors MN1 (i.e., the high voltage elements 202). The second gate 204a and the first areas of each of the first active regions 210 together form a plurality of second transistors MN2 (i.e., the low voltage elements 204). In addition, the area between the first gate 202a and the second gate 204a in the first area of each first active region 210 can be electrically coupled to the corresponding bit line (such as bit line BL0) through a connection structure like a contact.

Similarly, in the second area of each first active region 210, the first gate 202a and the second gate 204a extend in the second direction Y and arranged above each of the first active regions 210. The first gate 202a and the second gate 204a are substantially perpendicular to the second areas of each of the first active regions 210. The second gate 204a is closer to the second active region 212 than the first gate 202a. The first gate 202a and the second areas of each of the first active regions 210 together form a plurality of first transistors MN4 (i.e., the high voltage elements 202). The second gate 204a and the second areas of each of the first active regions 210 together form a plurality of second transistors MN3 (i.e., the low voltage elements 204). In addition, the area between the first gate 202a and the second gate 204a in the second area of each first active region 210 can be electrically coupled to the corresponding bit line (such as bit line BL1) through a connection structure like a contact.

As described above, the gate length L2 of the gate (i.e., the second gate 204a) of the second transistor MN2 (MN3) is smaller than the gate length L1 of the gate (i.e., the first gate 202a) of the first transistor MN1 (MN4). In addition, the second active region 212 is a common active region for connecting the common source line CSL. Therefore, in this configuration, the active region 212 that is coupled to the node for connecting to the common source line CSL in each switching unit 200 of the switching 106b is in common.

Regarding the operation method, the switching unit 200 connected to the bit line BL0 in FIG. 3C is used as an example for explanation. When the read operation is performed, a memory cell is specified by a bit line and a word line is selected by the row decoder 104a and the column decoder 104b as shown in FIG. 1. At this time, the bias selection signal Bias_select0 can turn off the second transistor MN2 of the switching unit 200, and the bit line selection signal BLS0 turns on the first transistor MN1 of the switching unit 200.

In this way, when the bit line BL0 is selected, the data stored in the memory cell located at the intersection of the bit line BL0 and a selected word line WL can be transmitted through the corresponding bit line BL0 to the corresponding sense amplifier SA for read. The operation for reading other bit lines is performed in the same manner.

In addition, when the erasing operation is performed, the bias voltage selection signal Bias_select0 can turn on the transistor MN2, and the bit line selection signal BLS0 can turn off the transistor MN1. In this way, the erase voltage applied to the common source line CSL can be applied to the bit line BL0 through the transistor MN2 to erase all the memory cells on the bit line BL0. Since the flash memory is erased using block erase, memory cells on other bit lines are also erased in the same way. At the same time, referring to the voltage application path shown by the bold line in FIG. 2, taking the bit line BL0 as an example, the erase voltage applied to the common source line CSL can be applied to each memory cell from the top of the memory cell string through bit line BL0, and on the one hand, each memory cell can be also erased from bottom the memory cell string. That is, this erase operation is a two-side erase, in which one side is from the bit line side and the other side is from the source line side. When the number of memory cells on each memory cell string increases, the two-side erase can increase the erase speed.

FIG. 4A to FIG. 4J are schematic views illustrating the manufacturing process of the switching device of the page buffer according to one embodiment of the present invention. The cross-sectional views are taken along the line A-A' in FIG. 3B.

Figure 4A:
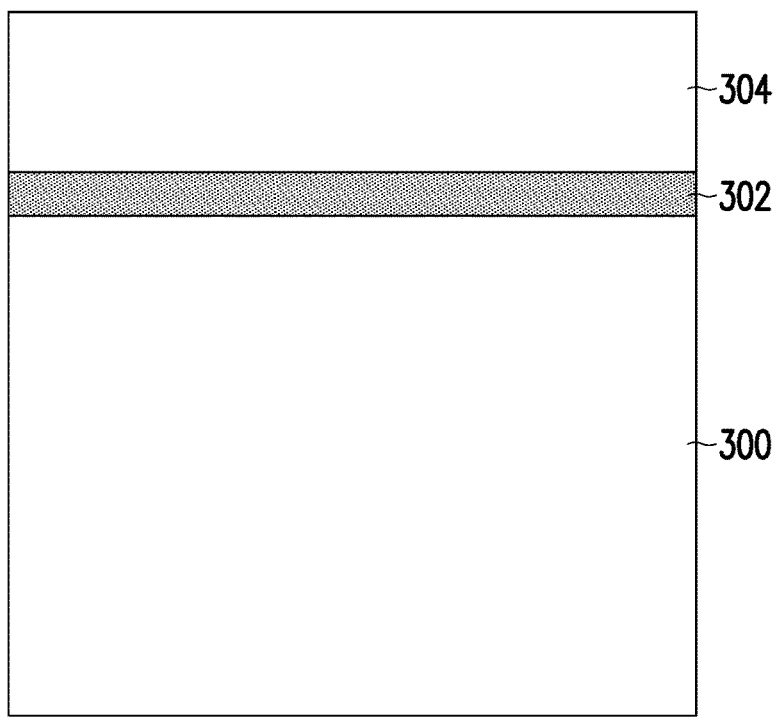
FIG. 4A to FIG. 4J are schematic views illustrating the manufacturing process of the switching device of the page buffer according to the present invention.
Figure 4B:
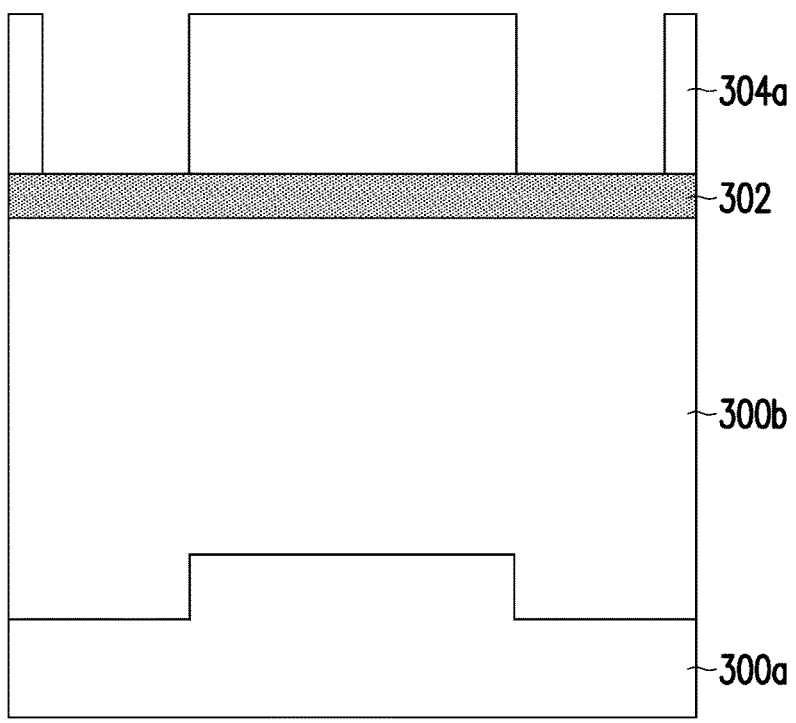

As shown in FIG. 4A, a substrate 300 is provided first, and a pad oxide layer 302 and a silicon nitride layer 304 are sequentially formed on a substrate 300. Next, in FIG. 4B, the silicon nitride layer 304 is patterned into a silicon nitride layer 304a. The patterned silicon nitride layer 304a is used as a mask for implantation. A structure 300b having well regions is formed on the substrate 300a by implantation process. In one example, an N-well of the structure 300b or the like can be formed on a P-type substrate 300a.

Figure 4C:
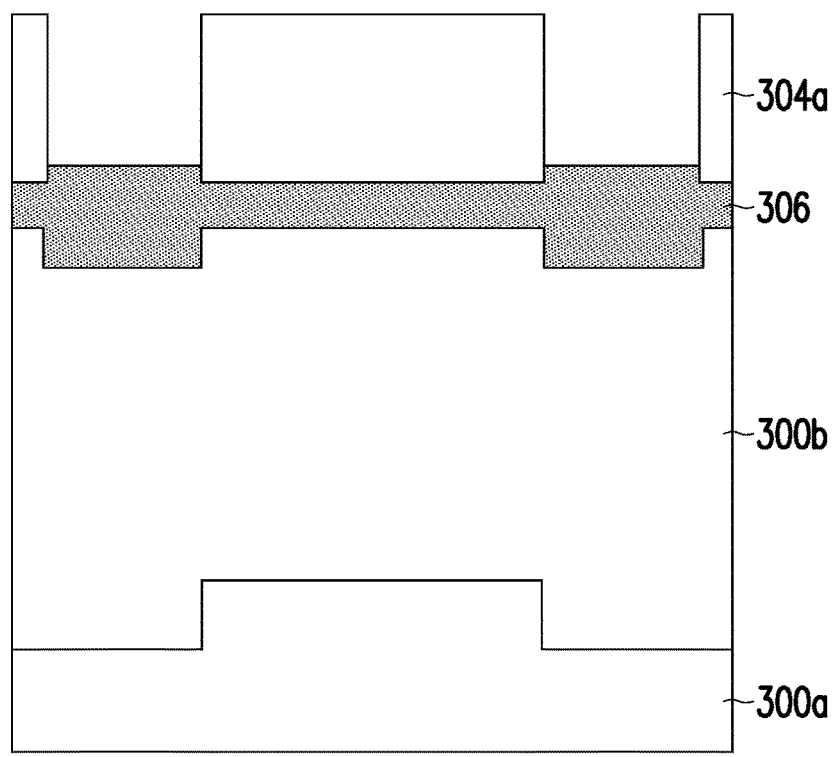
Figure 4D:
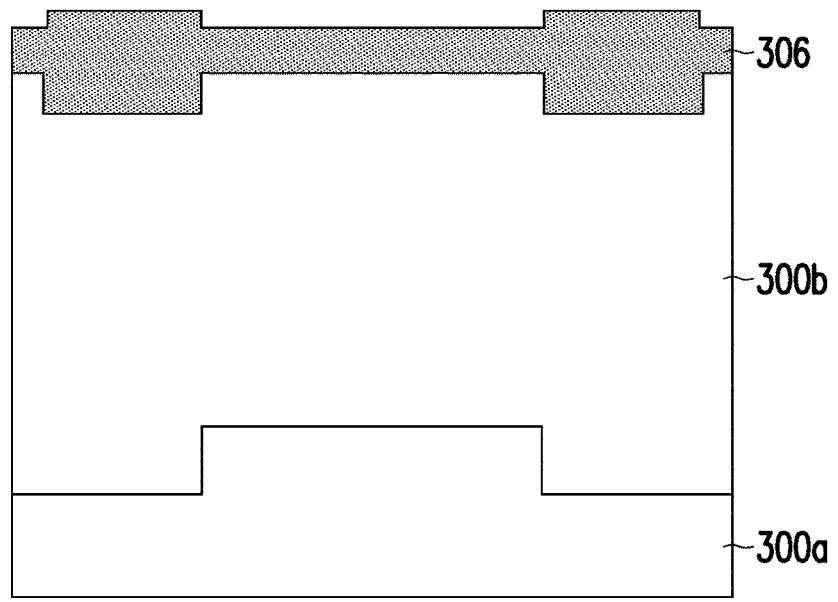

In FIG. 4C, the pad oxide layer 302 not covered by the silicon nitride layer 304a is removed. A thicker oxide portion is formed med by thermal oxidation method on the same positions. An oxide layer 306 including thicker oxide portion is formed on the structure 300b. Next, in FIG. 4D, the patterned silicon nitride layer 304a is removed. The oxide layer 306 is exposed.

Figure 4E:
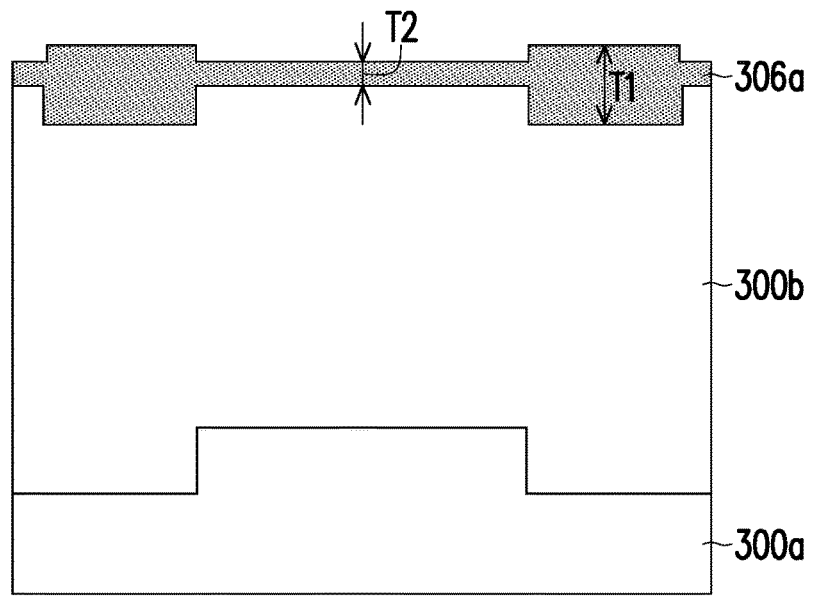
Figure 4F:
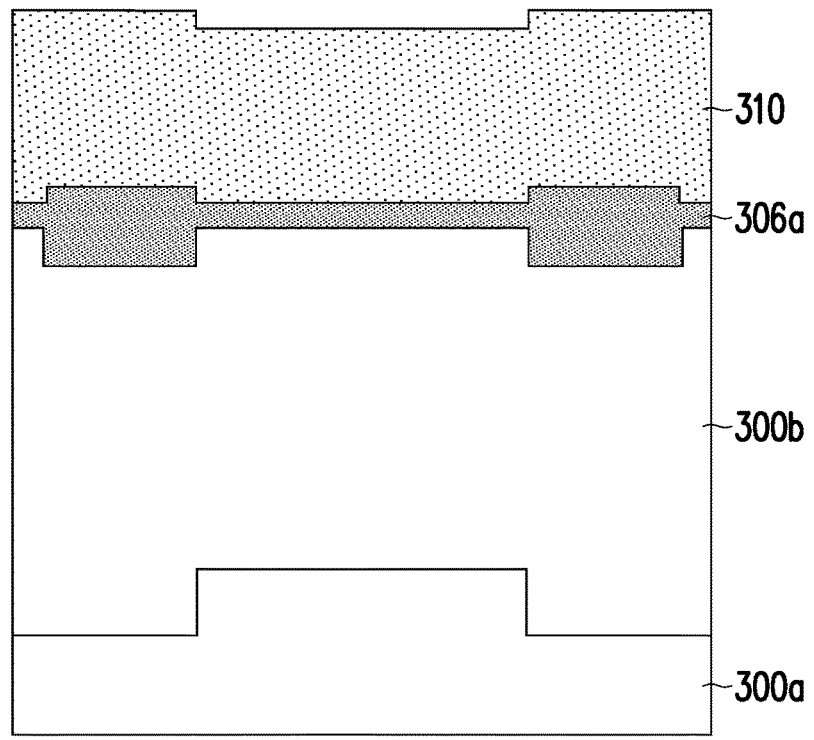
Figure 4G:
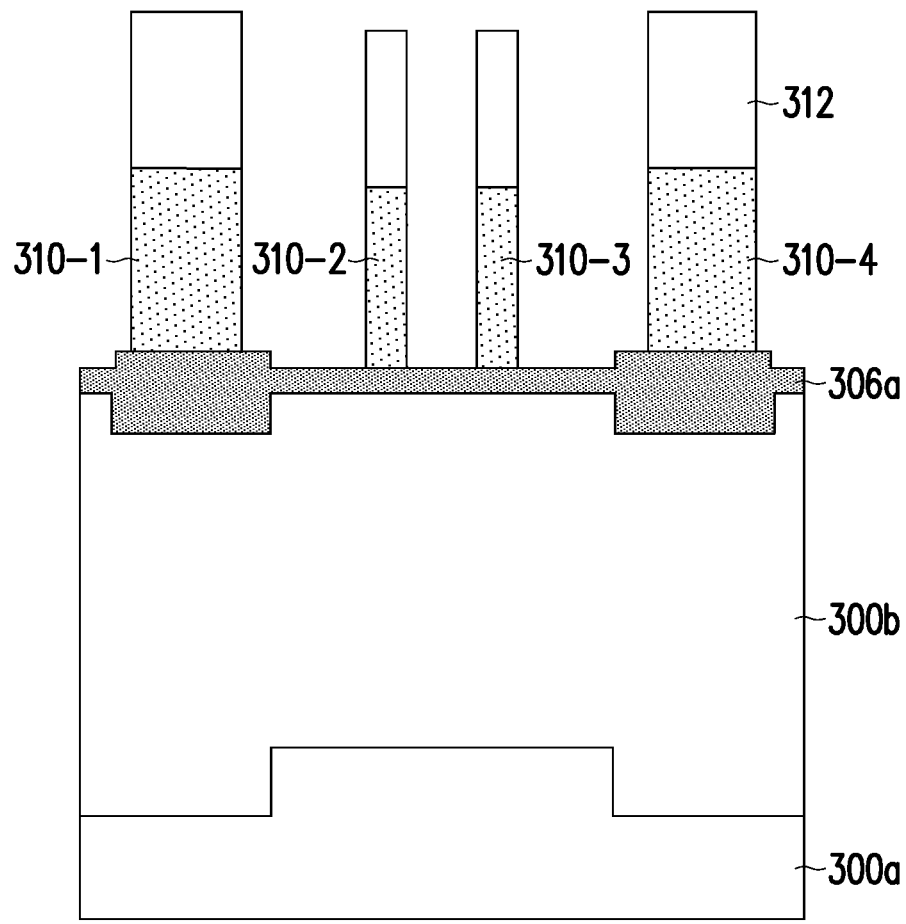

Next, in FIG. 4E, the oxide layer 306 is etched back for cleaning and the oxide layer 306 is partially reduced in thickness. Then, a growth of thin oxide layer is performed to finally form a gate oxide layer 306a. The gate oxide layer 306a includes a thicker portion with a thickness T1 and a thinner portion with a thickness T2. The thickness T1 is larger than the thickness T2. Next, in FIG. 4F, a conductor layer 310 is formed on the gate oxide layer 306a by a deposition method. The conductor layer 310 comprises, for example, polysilicon and metal silicide. The metal silicide can be, for example, tungsten silicide. Next, in FIG. 4G, a mask layer 312 is formed on the conductor layer 310. The mask layer 312 has a pattern as a gate electrode for patterning the conductor layer 310 to form gates 310-1, 310-2, 310-3, and 310-4. In one example, the conductor layer 310 may be patterned by etching to form gates 310-1, 310-2, 310-3, and 310-4.

Figure 4H:
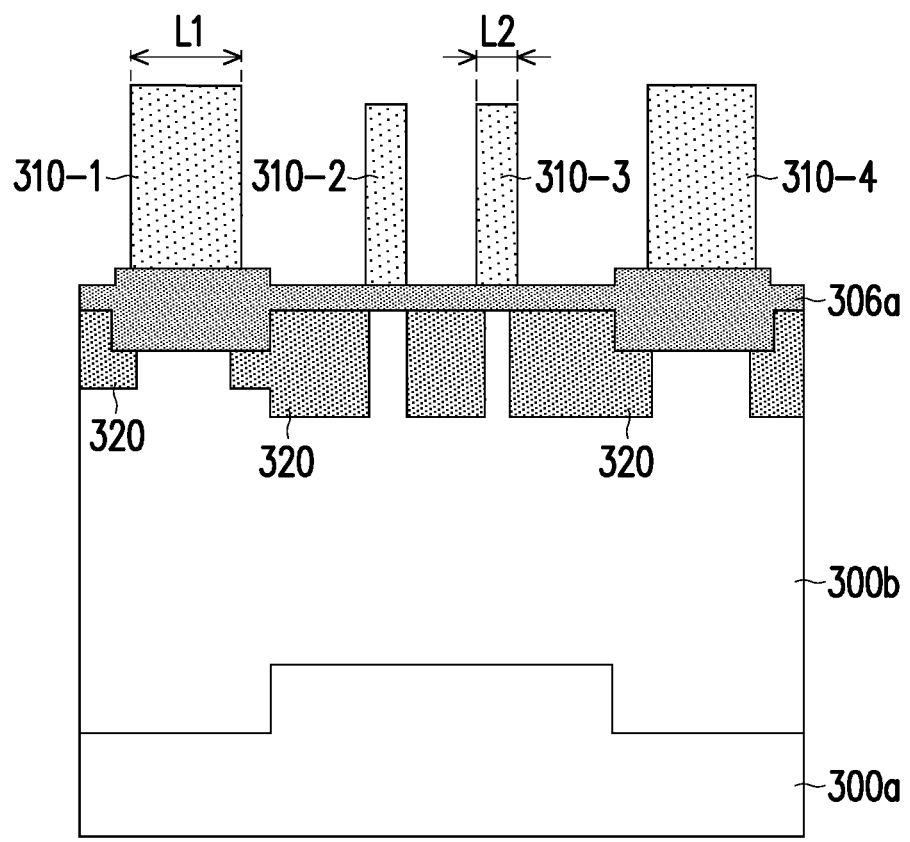
Figure 4I:
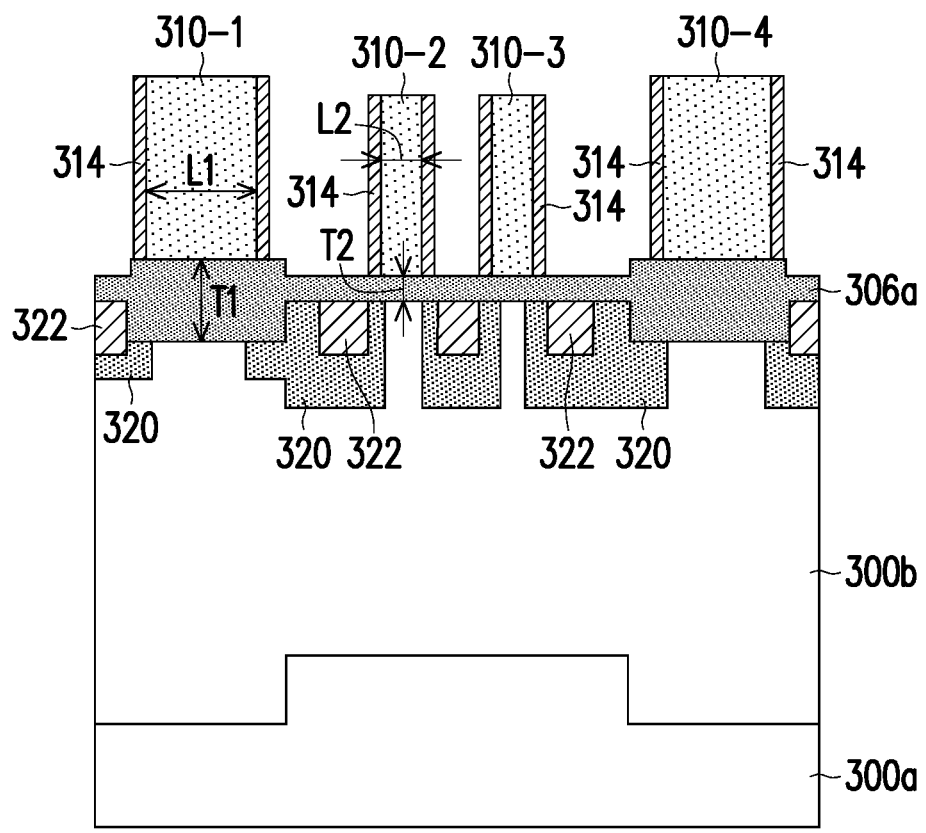
Figure 4J:
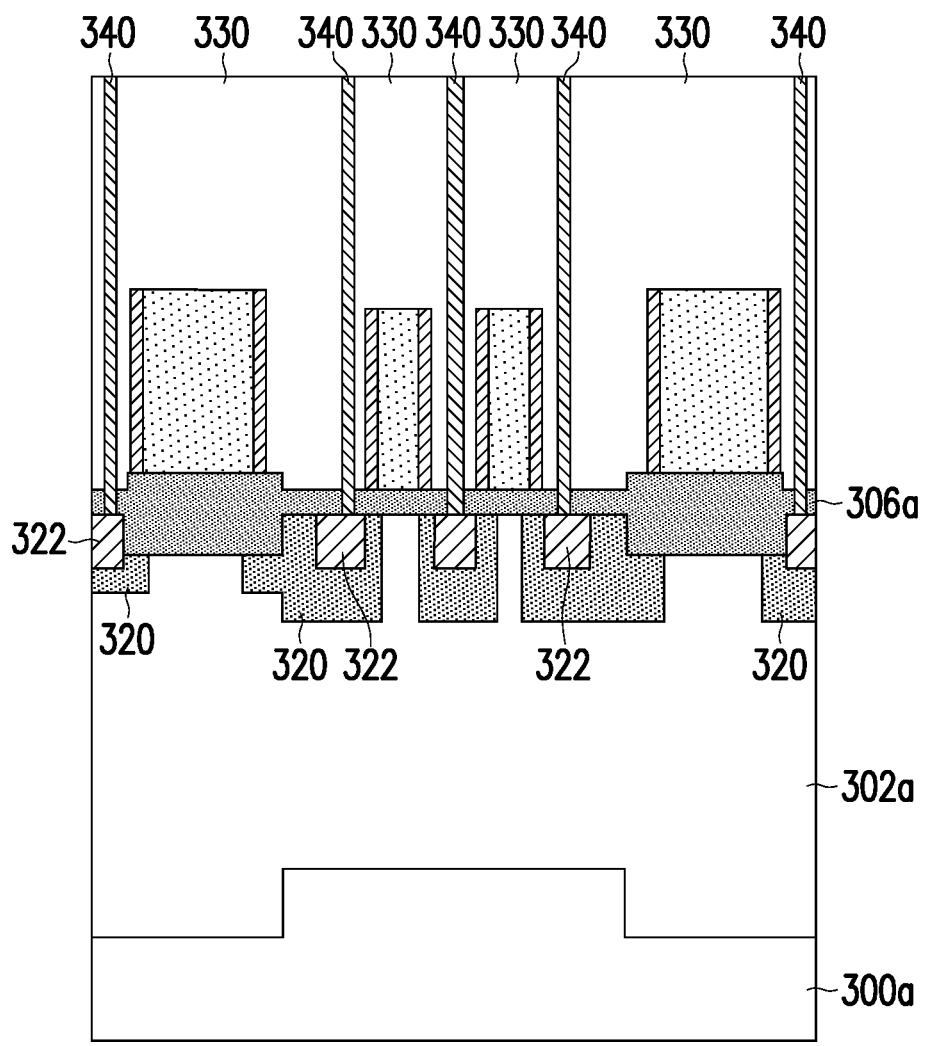

In FIG. 4H, the mask layer 312 is removed to expose the gates 310-1, 310-2, 310-3, and 310-4. A plurality of LDD regions 320 is formed in the well region 300b. Next, in FIG. 4I, a spacer 314 is formed around sidewalls of each of the gates 310-1, 310-2, 310-3, and 310-4. In addition, a plurality doped regions 322 are formed in the well region 300b. Here, each doped region 322 acts as a source/drain of a transistor. Each doped region 322 together with each gate electrode 310-1, 310-2, 310-3, and 310-4 respectively forms a transistor, which is equivalent to the transistors MN1, MN2, MN3, and MN4 in FIG. 3C.

Next, an interlayer dielectric layer 330 is formed on the gates 310-1, 310-2, 310-3, and 310-4. After that, contact openings are formed in the interlayer dielectric layer 330 at positions aligned with the doped regions 322, and then the contact openings are filled with metal material to form the contact 340.

Among the transistors MN1, MN2, MN3 and MN4 formed in the above manner, the transistors MN2 and MN3 are used as the low voltage elements 204 and their gate length is L2. The gates of transistors MN2 and MN3 may referred to gates 310-2 and 310-3 in FIG. 4I respectively. The transistors MN1 and MN4 are used as the high voltage elements 202 and their gate length is L1, in which the length L1 is larger than the length L2. The gates of transistors MN1 and MN4 may referred to gates 310-1 and 310-4 in FIG. 4I respectively. In an example, the length L1 may be 1 μm while the length L2 is about 0.35 In addition, the thickness T2 of the gate oxide of transistors MN2 and MN3 can be about 70 Å, while the thickness T1 of the gate oxide of transistors MN1 and MN4 is about 400 Å.

The above description is only an exemplary example of forming the transistors MN1, MN2, MN3 and MN4 of the switching device. The present invention does not limit the method of forming these transistors. Any method capable of forming switching device of the present invention may be used.

Figure 5:
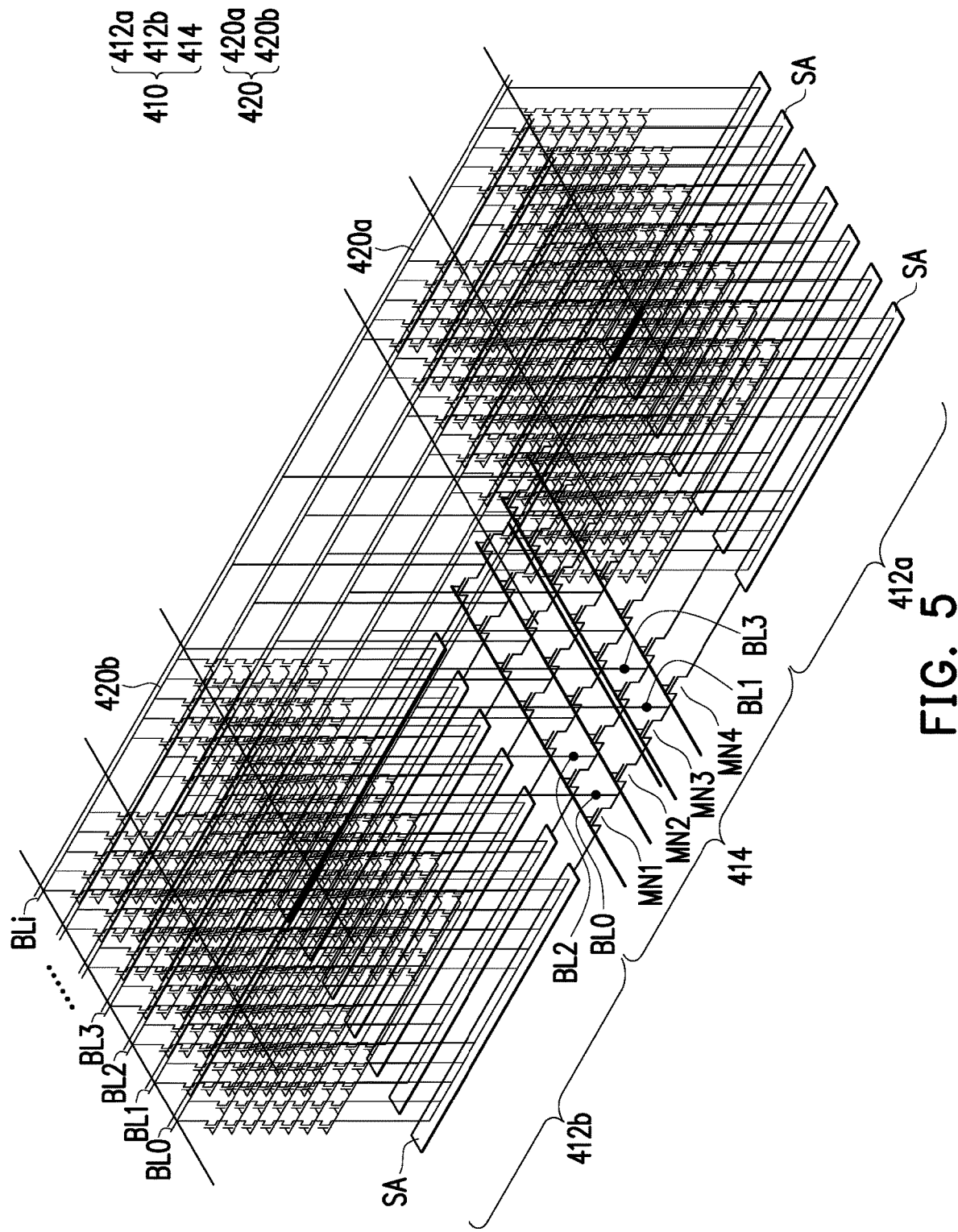
FIG. 5 is a schematic structural diagram of a 3D flash memory applying the switching device of the page buffer of the present invention.

FIG. 5 is a schematic structural diagram of a 3D flash memory applying the switching device of the page buffer of the present invention. The switching device of the page buffer of the present invention is not only applicable to a two-dimensional memory structure, but also can be applied to a three-dimensional memory structure.

As shown in FIG. 5, it is a schematic diagram illustrating the structure of a three-dimensional NAND flash memory. In this example, the page buffer 410 is disposed below the memory cell array 420. As shown in FIG. 5, the page buffer 410 comprises a sense amplification circuit 412 and a switching device 414. The sense amplification circuit 412 further comprises a first sense amplification circuit 412a and the second sense amplification circuit 412b, which respectively have a plurality of sense amplifiers SA. The structure of the switching device 414 may be, for example, the structure shown in the FIGS. 3B to 3C.

In the example shown in FIG. 5, the memory cell array 420 includes a plurality of vertical channel pillars. Each vertical channel pillar includes a string of memory cells and is coupled to a corresponding bit line (BL0~BLi). The vertical channel pillar penetrates downwards through multiple alternating pairs of conductive layers (gate layer or word line layer) and insulating layers. The insulating layers can be made of a dielectric material, e.g., silicon oxide. The conductive layers can be made of a conductive material, e.g., a metal such as Tungsten (W). The conductive layers can form one more string select lines (SSLs), one or more word lines (WLs), and one or more ground select lines (GSLs). An external surface of the vertical channel pillar contacts the conductive layers, which act as gates of the memory cells. The vertical channel pillar can include multiple layers that can include a tunneling layer, a charge trapping layer, and a blocking layer. The tunneling layer can include a silicon oxide, or a silicon oxide/silicon nitride combination (e.g., Oxide/Nitride/Oxide or ONO). The charge trapping layer can include silicon nitride or other materials capable of trapping charges. The blocking layer can include silicon oxide, aluminum oxide, and/or combinations of such materials. The multiple layers can be formed on an internal surface of the vertical channel pillar, and polysilicon can be filled in a middle of the vertical channel pillar. The filled materials (e.g., the multiple layers and polysilicon) in each vertical channel pillar intersecting the conductive layers can form a string of memory cells along the vertical direction such as Z direction.

In the example shown in FIG. 5, the memory cell array 420 may comprise a first sub array 420a and a second sub array 420b. The first sub array 420a and the second sub array 420b both comprise bit lines BL0~BLi, in which the bit lines BL0~BLi of the first sub array 420a and the second sub array 420b are respectively and electrically connected to each other. The first sub array 420a and the second sub array 420b respectively have the corresponding first sense amplification circuit 412a and second sense amplification circuit 412b. The first sense amplification circuit 412a and the second sense amplification circuit 412b may be disposed below the first sub array 420a and the second sub array 420b, respectively. That is the first sense amplification circuit 412a and the second sense amplification circuit 412b are disposed below the plurality of vertical channel pillars of the first sub array 420a and the second sub array 420b.

In the example shown in FIG. 5, the switching device 414 may be disposed below and between the first sub array 420a and the second sub array 420b. As mentioned above, in the switching device 414, the node between the transistors MN1 and MN2 can be connected upwards to the bit line BL0 of the first sub array 420a and the second sub array 420b using metal wires or metal connection structures, for example. Similarly, the other bit lines BL1~BLn are also coupled to the switching device 414 in the same manner.

In addition, the operations of reading, writing, and erasing the memory cell array 420 by using the switching device 414 of the page buffer 410 is as described above, and will not be described in detail here. In addition, the aforementioned arrangement of the memory cell array 420 is only an example, and the arrangement of the memory cell array 420 can be arbitrarily changed or modified, which does not affect the arrangement and operation concept of the switching device 414 of the present invention.

Figure 6:
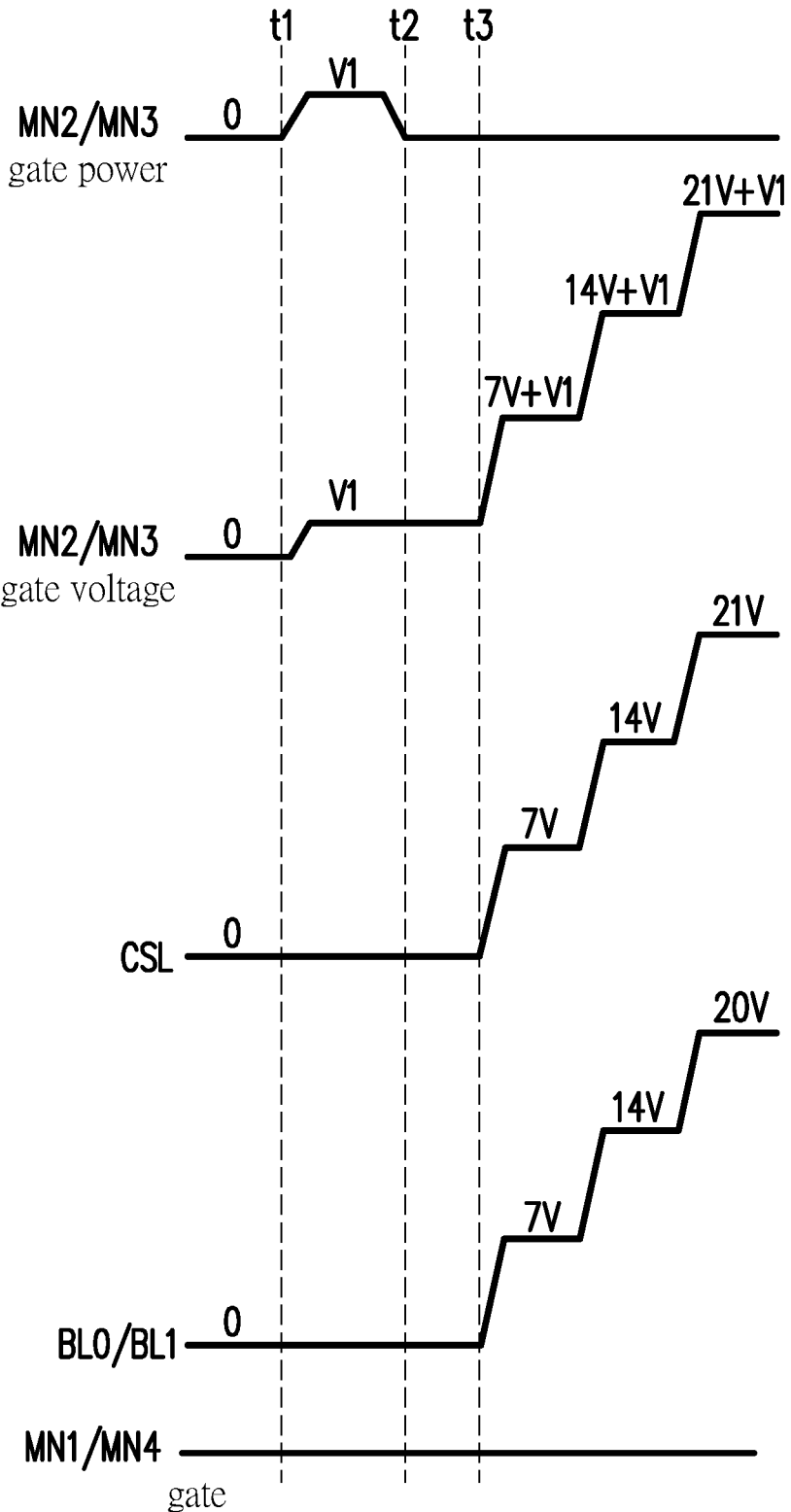
FIG. 6 is a schematic diagram of voltage waveforms when the switching device of the page buffer according to the embodiment of the present invention performs an erase operation.

FIG. 6 is a schematic diagram of voltage waveforms when the switching device of the page buffer according to the embodiment of the present invention is used to perform an erase operation. Here, the first transistor MN1 and the second transistor MN2 in FIG. 3C are taken as examples for description, and the operation timings for the transistors MN3 and MN4 are the same.

In addition, in order to simplify the description below, one bit line BL0 is used for description, the erase operation of the memory cell array is actually performed in the manner of block erase. In addition, the following description will take the erase voltage of 21V as an example, but the specific erase voltage is not particularly limited in the present invention. In addition, the erasing method described herein can be applied to the aforementioned two-dimensional or three-dimensional memory cell array.

As shown in FIG. 6, during the erasing operation, the first transistor MN1 is turned off, and the second transistor MN2 is turned on, so that the erase voltage can be applied to the bit line BL0 through the common source line CSL. Initially, the gate power having a voltage (first voltage) V1 for the gate of the second transistor MN2 is supplied from the power supply side (i.e., the power supply that supplies the gate voltage) between time t1 and t2, and then the power supply is turned off at time t2. At the same time, the gate of the second transistor MN2 is raised to the voltage V1, and the voltage of the gate of the second transistor MN2 is maintained at the voltage V1 after time t2. At this time, the channel of the second transistor MN2 is turned on, which can be regarded as a capacitor, and the gate is in a floating state.

Then, after the voltage applied to the gate of the second transistor MN2 is stabilized at the voltage V1 for a preset time, such as time point t3, the erase voltage is applied to the common source CSL. In this example, in order to prevent the gate of the second transistor MN2 from receiving an excessively high voltage at once, the erasing voltage may be applied to the common source CSL in a stepwise manner. By using the turn-on of the channel of the second transistor MN2, the erase voltage applied to the common source CSL can further boost the voltage of the gate of the second transistor MN2 to the erase voltage (e.g., 21V).

In this embodiment, the erase voltage is applied to the common source CSL in three steps. For example, first an erase voltage of 7V is applied for a period of time to the common source CSL, then the erase voltage is increased to 14V and applied to the common source CSL for a period of time, and finally the erase voltage is increased to 21V. In addition, when the erase voltage is applied to the common source CSL, the gate voltage of the gate of the second transistor MN2 is further boosted to 7V+V1, 14V+V1 and 21V+V1, respectively. At the same time, the bit line voltage applied to the bit line BL0 is also gradually boosted from 0V to 7V, 14, and then 20V. The voltage applied to the bit line BL0 will turn off the channel due to the body effect, so that the voltage of the bit line BL0 will be slightly lower than the erase voltage of 21V.

In addition, the aforementioned application of the erase voltage to the common source line CSL is performed in a stepwise manner, but the erase voltage of 21V may be directly applied at one time. In addition, in the above example, the erase voltage applied to the common source line CSL is performed in the manner of 7V, 14V, 21V, that is, the applied erase voltage in each step is increased with the same increment, but the increment may not be equal. In addition, the time interval of applying the erase voltage in each step may be equal or different. The manner of applying the erase voltage to the common source line CSL can be changed in various ways, and the manner of applying the erase voltage depends on the actual application.

According to an embodiment of the present invention, when erasing a block of the memory cell array, in addition to applying the erasing voltage from the bit line BL side, the erase voltage can also be applied from the common source line CSL side (source line side). That is, when performing block erasing of the memory cell array with the switching device of the page buffer of at least one embodiment of the present invention, the erase voltage can be applied from both side of each memory cell string to accelerate the erasing speed.

Figure 7:
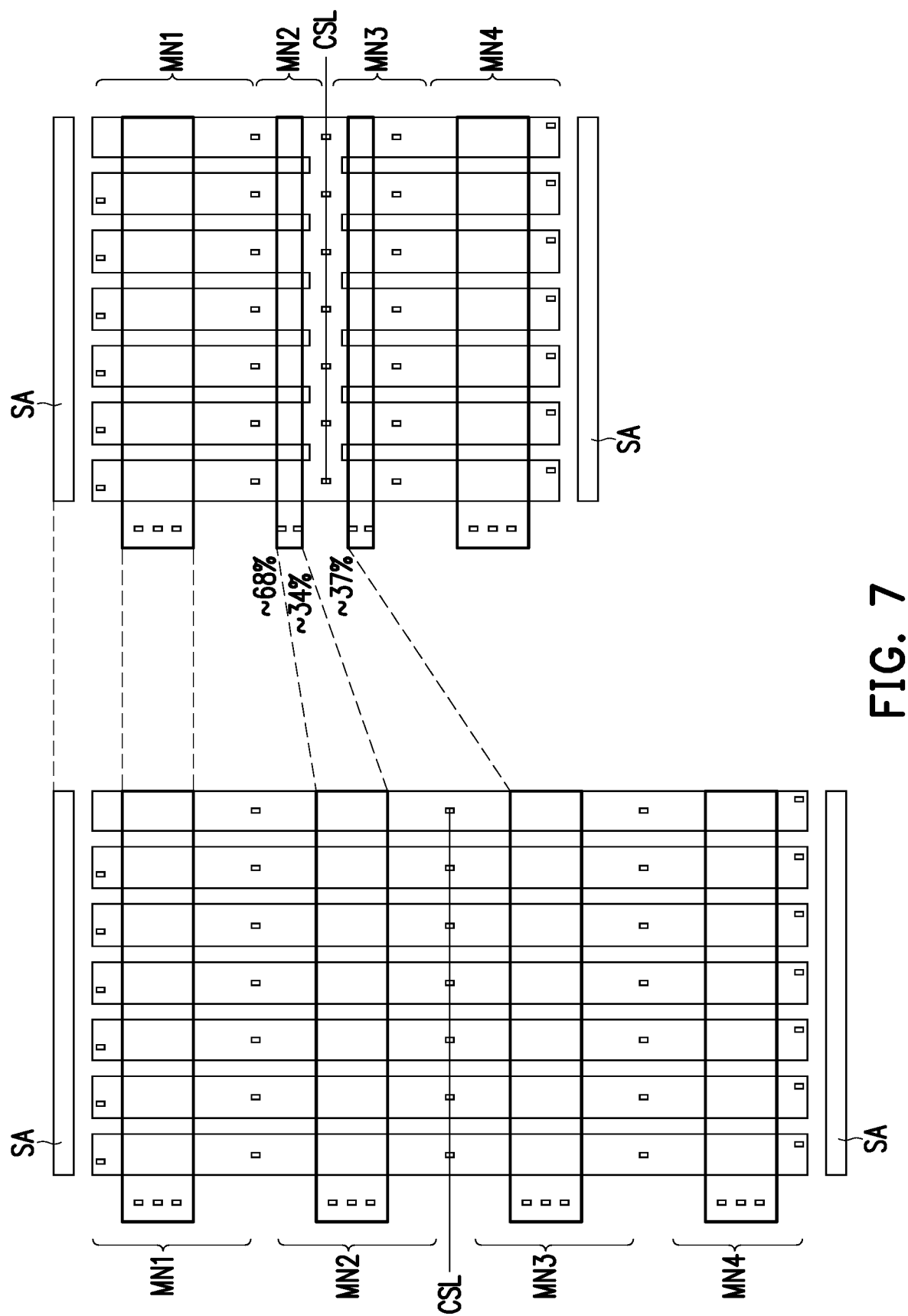
FIG. 7 is a schematic diagram illustrating the area reduction effect of the switching device of the page buffer according to the embodiment of the present invention.

FIG. 7 is a schematic diagram illustrating the area reduction effect with the switching device of the page buffer according to the embodiment of the present invention.

As shown in FIG. 7, the compression ratio of the gate of the second transistor MN2 of at least one embodiment of the present invention is reduced by about 34% compared with that of the gate of the second transistor MN2 of the existing structure. Compared with the existing structure, the area compression ratio of the active area between the gate of the first transistor MN1 and the gate of the second transistor MN2 of the present invention is reduced by about 68%. In addition, the active area for the common source line CSL in at least one embodiment of the present invention is shared, so the area compression ratio can be reduced by about 37%.

Therefore, according to the switching device of the page buffer of at least one embodiment of the present invention, a high voltage transistor element is replaced by a low voltage transistor element (such as the second transistors MN2, MN3), and make its gate length smaller than the first transistors MN1 and MN4 as high-voltage transistor elements. In addition, the active region for the common source line CSL is shared. With the structure of the switching device, the layout area of the switching device can be further reduced, and the layout area of the memory device can also be reduced.

What is claimed is:

1. A memory device having a switching device for a page buffer, comprising:
 a plurality of switching units coupled between a memory cell array and a sense amplification circuit of a page buffer,
 wherein each of the plurality of switching units further comprises:
 a high voltage element and a low voltage element that are connected in series to each other;
 a first end of the high voltage element is coupled to the sense amplification circuit, and a first end of the low voltage element is coupled to a common source line of the memory cell array; and
 a second end of the high voltage element and a second end of the low voltage element are connected to each other and coupled to a corresponding bit line of the memory cell array, wherein
 the common source line coupled to each of the plurality of switching units shares a common active region.

2. The memory device having a switching device of the page buffer according to claim 1, wherein the high voltage element and the low voltage element are a first transistor and a second transistor, respectively,
 the first transistor has a first source/drain and a second source/drain, the first source/drain is coupled to a sense amplifier corresponding to the corresponding bit line, and the second source/drain is coupled to the corresponding bit line,
 the second transistor has a first source/drain and a second source/drain, the first source/drain is coupled to the corresponding bit line, the second source/drain is coupled to the common source line, and
 a gate length of the second transistor is smaller than a gate length of the first transistor.

3. The memory device having a switching device for a page buffer according to claim 2, wherein a layout structure of the switching device comprises:
 a plurality of first active regions extending along a first direction;
 a second active region extending along a second direction and connecting to the plurality of the first active regions, wherein the second active region divides each of the plurality of the first active regions into a first area and a second area, and the first direction and the second direction are intersected to each other; and
 a first gate and a second gate extending along the second direction, and arranged in each of the first area and the second area and above each of the plurality of first active regions, wherein the second gate is closer to the second active region than the first gate.

4. The memory device having a switching device for a page buffer according to claim 3,
 wherein each of the plurality of first active regions in the first area, the first gate and each of the plurality of first active regions form the first transistor and the second gate and each of the plurality of first active regions form the second transistor,
 each of the plurality of first active regions in the second area, the first gate and each of the plurality of first active regions form the first transistor and the second gate and each of the plurality of first active regions form the second transistor, and
 the gate length of the second transistor in the first direction of the second gate is smaller than the gate length of the first transistor in the first direction of the first gate.

5. The memory device having a switching device for a page buffer according to claim 2, wherein a ratio of the gate length of the first transistor to the gate length of the second transistor is 3 to 4.

6. The memory device having a switching device for a page buffer according to claim 2, wherein a thickness of a gate oxide layer of the second transistor is smaller than a thickness of a gate oxide layer of the first transistor.

7. The memory device having a switching device of a page buffer according to claim 1, wherein the memory cell array is the three-dimensional structure, and the page buffer is disposed under the memory cell array.

8. The memory device having a switching device of a page buffer according to claim 7,
 wherein the memory cell array further comprises a first sub array and a second sub array, and the sense amplification circuit of the page buffer further comprises a first sense amplification circuit and a second sense amplification circuit,
 the first sense amplification circuit and the second sense amplification circuit are respectively arranged below the first sub array and the second sub array, and
 the switching device is arranged under the memory cell array and between the first sub array and the second sub array.

9. A memory device having a switching device of a page buffer, comprising:
 a memory cell array, including a plurality of bit lines, a plurality of word lines and a plurality of memory cells, each of the plurality of memory cells is respectively disposed at intersections of the plurality of word lines and the plurality of bit lines; and
 a page buffer is coupled to the plurality of bit lines of the memory cell array, the page buffer further includes a switching device and a sense amplifier circuit,
 wherein the switching device further includes:
 a plurality of switching units coupled between the memory cell array and the sense amplification circuit,
 wherein each of the plurality of switching units further comprising: a high voltage element and a low voltage element that are connected in series to each other,
 a first end of the high voltage element is coupled to the sense amplification circuit, and a first end of the low voltage element is coupled to a common source line of the memory cell array;
 a second end of the high voltage element and a second end of the low voltage element are connected to each other and coupled to a corresponding bit line of the memory cell array, wherein
 the common source line coupled to each of the plurality of switching units shares a common active region.

10. The memory device having a switching device of a page buffer according to claim 9, wherein the high voltage element and the low voltage element are a first transistor and a second transistor, respectively,
 the first transistor has a first source/drain and a second source/drain, the first source/drain is coupled to a sense amplifier corresponding to the corresponding bit line, and the second source/drain is coupled to the corresponding bit line,
 the second transistor has a first source/drain and a second source/drain, the first source/drain is coupled to the corresponding bit line, the second source/drain is coupled to the common source line, and
 a gate length of the second transistor is smaller than a gate length of the first transistor.

11. The memory device having a switching device for a page buffer according to claim 10, wherein a layout structure of the switching device comprises:
- a plurality of first active regions extending along a first direction;
- a second active region extending along a second direction and connecting to the plurality of the first active regions, wherein the second active region divides each of the plurality of the first active regions into a first area and a second area, and the first direction and the second direction are intersected to each other; and
- a first gate and a second gate extending along the second direction, and arranged in each of the first area and the second area and above each of the plurality of first active regions, wherein the second gate is closer to the second active region than the first gate.

12. The memory device having a switching device for a page buffer according to claim 11,
- wherein each of the plurality of first active regions in the first area, the first gate and each of the plurality of first active regions form the first transistor and the second gate and each of the plurality of first active regions form the second transistor,
- each of the plurality of first active regions in the second area, the first gate and each of the plurality of first active regions form the first transistor and the second gate and each of the plurality of first active regions form the second transistor, and
- the gate length of the second transistor in the first direction of the second gate is smaller than the gate length of the first transistor in the first direction of the first gate.

13. The memory device having a switching device of a page buffer according to claim 10, wherein a ratio of the gate length of the first transistor to the gate length of the second transistor is 3 to 4.

14. The memory device having a switching device of a page buffer according to claim 10, wherein a ratio of a thickness of a gate oxide layer of the second transistor to a thickness of a gate oxide layer of the first transistor is 5 to 6.

15. The memory device having a switching device of a page buffer according to claim 9, wherein the memory cell array is the three-dimensional structure, and the page buffer is disposed under the memory cell array.

16. The memory device having a switching device of a page buffer according to claim 15,
- wherein the memory cell array further comprises a first sub array and a second sub array, and the sense amplification circuit of the page buffer further comprises a first sense amplification circuit and a second sense amplification circuit,
- the first sense amplification circuit and the second sense amplification circuit are respectively arranged below the first sub array and the second sub array, and
- the switching device is arranged under the memory cell array and between the first sub array and the second sub array.

17. An erase method for a memory device, wherein the memory device includes a memory cell array and a page buffer couple to the memory cell array, the page buffer includes a switching device having a plurality of switching units, each of the switching unit includes a first transistor as a high voltage element and a second transistor as a low voltage element, the first and the second transistors are connected in series, a first end of the first transistor is coupled to a sense amplification circuit of the page buffer, and a first end of the second transistor is coupled to a common source line of the memory cell array, a second end of the first transistor and a second other end of the second transistor are connected to each other and coupled to a corresponding bit line of the memory cell array, and the common source line coupled to each of the plurality of switching units shares a common active region, the erase method for each of the switching unit comprising:
- turning off the first transistor;
- applying a first voltage to a gate of the second transistor to turn on the second transistor;
- when the first voltage applied to the gate of the second transistor is stably maintained for a preset time, an erase voltage is applied to the common source line;
- boosting a gate voltage on the gate of the second transistor by the erase voltage to a sum of the erase voltage and the first voltage, and boosting a bit line voltage on the corresponding bit line to the erase voltage; and
- performing a two-side erase on memory cells on the corresponding bit line.

18. The erase method according to claim 17, wherein a common voltage on the common source line is increased up to the erase voltage in a multiple step manner.

19. The erase method according to claim 18, wherein an increment for each step of the multiple step manner is the same or different.

20. The erase method according to claim 18, wherein an application time for each step of the multiple step manner is the same or different.

* * * * *